(12) United States Patent
Kitada et al.

(10) Patent No.: US 9,515,037 B2
(45) Date of Patent: Dec. 6, 2016

(54) SEMICONDUCTOR DEVICE HAVING THROUGH SILICON VIAS AND MANUFACTURING METHOD THEREOF

(75) Inventors: Ryohei Kitada, Tokyo (JP); Masahiro Yamaguchi, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 0 days.

(21) Appl. No.: 13/489,975

(22) Filed: Jun. 6, 2012

(65) Prior Publication Data
US 2012/0313258 A1 Dec. 13, 2012

(30) Foreign Application Priority Data
Jun. 8, 2011 (JP) .................................. 2011-128249

(51) Int. Cl.
*H01L 23/02* (2006.01)
*H01L 23/48* (2006.01)
(Continued)

(52) U.S. Cl.
CPC ......... *H01L 24/13* (2013.01); *H01L 21/76898* (2013.01); *H01L 23/293* (2013.01); *H01L 23/3128* (2013.01); *H01L 23/3135* (2013.01); *H01L 23/3171* (2013.01); *H01L 23/3192* (2013.01); *H01L 23/481* (2013.01); *H01L 23/49816* (2013.01); *H01L 23/5226* (2013.01); *H01L 24/14* (2013.01); *H01L 25/0657* (2013.01); *H01L 21/6836* (2013.01); *H01L 24/11* (2013.01); *H01L 24/16* (2013.01); *H01L 2221/68359* (2013.01); *H01L 2224/11002* (2013.01); *H01L 2224/13009* (2013.01); *H01L 2224/13021* (2013.01); *H01L 2224/13022* (2013.01); *H01L 2224/14181* (2013.01); *H01L 2224/16145* (2013.01); *H01L 2224/16146* (2013.01); *H01L 2224/16225* (2013.01); *H01L 2225/06513* (2013.01); *H01L 2225/06517* (2013.01); *H01L 2225/06541* (2013.01); *H01L 2225/06565* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01);
(Continued)

(58) Field of Classification Search
USPC ........ 257/774, 777, 737, 760, 686, E23.169, 257/E23.011, E23.179, E21.505; 438/109, 438/667, 117
See application file for complete search history.

(56) References Cited

U.S. PATENT DOCUMENTS 8,517,280 B2 * 8/2013 Owada ........................ 235/494
2005/0017338 A1 * 1/2005 Fukazawa ................... 257/686
(Continued)

FOREIGN PATENT DOCUMENTS

JP 10233399 A 9/1998
JP 11087404 A 3/1999
(Continued)

*Primary Examiner* — Mohammad Islam
*Assistant Examiner* — Jay C Chang

(57) ABSTRACT

In The semiconductor device, a semiconductor substrate has first and second surfaces. A circuitry layer is formed over the first surface and a first insulating layer is further formed over the circuitry layer. A second insulating layer including a first insulating element is formed over the second surface. A third insulating layer including a second insulating element different from the first insulating element of the second insulating layer is formed over the second surface with an intervention of the second insulating layer therebetween. A penetration electrode penetrates through the semiconductor substrate, the circuitry layer, the first insulating layer, the second insulating layer and the third insulating layer.

19 Claims, 9 Drawing Sheets

(51) Int. Cl.
*H01L 23/52* (2006.01)
*H01L 29/40* (2006.01)
*H01L 23/00* (2006.01)
*H01L 23/29* (2006.01)
*H01L 23/31* (2006.01)
*H01L 23/498* (2006.01)
*H01L 23/522* (2006.01)
*H01L 25/065* (2006.01)
*H01L 21/768* (2006.01)
H01L 21/00 (2006.01)
H01L 21/44 (2006.01)
H01L 21/683 (2006.01)

(52) U.S. Cl.
CPC .............. *H01L2924/01047* (2013.01); *H01L 2924/01079* (2013.01); *H01L 2924/15311* (2013.01); *H01L 2924/181* (2013.01)

(56) References Cited

U.S. PATENT DOCUMENTS

| | | | |
|---|---|---|---|
| 2005/0051883 A1 | 3/2005 | Fukazawa | |
| 2005/0112800 A1* | 5/2005 | Yamano | 438/113 |
| 2007/0008705 A1* | 1/2007 | Hashimoto | 361/760 |
| 2007/0052067 A1* | 3/2007 | Umemoto | 257/587 |
| 2008/0211095 A1* | 9/2008 | Nishizawa | 257/746 |
| 2008/0296779 A1 | 12/2008 | Matsui et al. | |
| 2009/0057892 A1 | 3/2009 | Osumi | |
| 2009/0189256 A1* | 7/2009 | Yoshimura et al. | 257/621 |

FOREIGN PATENT DOCUMENTS

| | | |
|---|---|---|
| JP | 2003031520 A | 1/2003 |
| JP | 2004342690 A | 12/2004 |
| JP | 2006191153 A | 7/2006 |
| JP | 2008-294367 A | 12/2008 |
| JP | 2009064812 A | 3/2009 |
| JP | 2010251347 A | 11/2010 |

\* cited by examiner

SEMICONDUCTOR DEVICE HAVING THROUGH SILICON VIAS AND MANUFACTURING METHOD THEREOF

BACKGROUND OF THE INVENTION

Field of the Invention

The present invention relates to a semiconductor device and a manufacturing method thereof.

Description of Related Art

A semiconductor device configured to have a chip stacked body mounted on a wiring substrate is conventionally proposed. The chip stacked body has a plurality of semiconductor chips stacked to one another, each of the semiconductor chips having through silicon vias or penetration electrodes penetrating therethrough. The semiconductor chips with through silicon vias have a small thickness of about 50 to 100 μm in view of a manufacturing process of the through silicon vias and are likely to have warpage.

When semiconductor chips with warpage are stacked to one another, a disconnection may occur between through silicon vias provided in one semiconductor chip and through silicon vias provided in another semiconductor chip. Such a disconnection tends to occur when the thickness of the semiconductor chips is small, 50 μm or less, for example.

Japanese Patent Application Laid-open No. 2008-294367 discloses a semiconductor device having a plurality of semiconductor chips stacked on a substrate, in which a reinforcing chip is provided to prevent the occurrence of warpage over an entire module due to stress generated by a difference in thermal contraction amounts between the substrate and the semiconductor chips during cooling, resulting from a difference in heating temperatures between the substrate and the semiconductor chips in a stacking process.

FIG. 9 is a cross-sectional view showing an example of a semiconductor chip having a through silicon via, which is applied to a conventional semiconductor device.

With reference to FIG. 9, a semiconductor chip 300 includes a semiconductor substrate 301, a circuit element layer 302 provided on a front surface 301a of the semiconductor substrate 301, a through silicon via 304 including a penetration via 303 that penetrates the semiconductor substrate 301, a front electrode 305 provided on one end of the through silicon via 304, a back electrode 306 provided on the other end of the through silicon via 304, a front resin layer 308 provided on a front surface 302a of the circuit element layer 302, and a back insulating layer 309 provided on a back surface 301b of the semiconductor substrate 301.

As described above, while the semiconductor chip 300 has the front resin layer 308 (polyimide resin, for example) on the front surface 302a of the circuit element layer 302 to protect the circuit element layer 302, only the back insulating layer 309 (a silicon nitride film, for example) is formed on the side of the back surface 301b of the semiconductor substrate 301.

When the semiconductor chips 300 with the configuration mentioned above are stacked and mounted by thermocompression bonding, the semiconductor chips 300 may warp because a difference in thermal expansion coefficients between the front resin layer 308 and the back insulating layer 309 is large.

While warpage occurring during cooling after heating at the time of mounting can be suppressed by the method disclosed in Japanese Patent Application Laid-open No. 2008-294367, suppression of warpage in semiconductor chips due to heating (heating for thermocompression bonding) in a stacking process is difficult.

When warpage occurs in the semiconductor chips 300 during heating and cooling in a stacking process, loose electrical connection between the semiconductor chips 300 may be increased, resulting in a lower yield of a semiconductor device.

SUMMARY

In one aspect of the present disclosure, there is provided a device that includes: a semiconductor substrate including first and second surfaces opposing to each other; a circuitry layer formed over the first surface of the semiconductor substrate; a first insulating layer formed over the circuitry layer; a second insulating layer formed over the second surface of the semiconductor substrate and comprising a first insulating element; a third insulating layer formed over the second surface of the semiconductor substrate with an intervention of the second insulating layer therebetween and comprising a second insulating element different from the first insulating element of the second insulating layer; and a penetration electrode penetrating through the semiconductor substrate, the circuitry layer, the first insulating layer, the second insulating layer and the third insulating layer.

In another aspect of the present disclosure provides such a device that comprises a first semiconductor chip and a second semiconductor chip stacked with the first semiconductor chip. The first semiconductor chip comprises: a first semiconductor substrate including first and second surfaces opposing to each other, a first circuitry layer formed over the first surface of the semiconductor substrate, a first insulating layer formed over the first circuitry layer, a second insulating layer formed over the second surface of the semiconductor substrate and comprising a first insulating element, a third insulating layer formed over the second surface of the first semiconductor substrate with an intervention of the second insulating layer therebetween and comprising a second insulating element different from the first insulating element of the second insulating layer, and a first penetration electrode penetrating through the first semiconductor substrate, the first circuitry layer, the first insulating layer, the second insulating layer and the third insulating layer. On the other hand, the second semiconductor chip comprises: a second semiconductor substrate including third and fourth surfaces opposing to each other, a second circuitry layer formed over the third surface of the semiconductor substrate, a fourth insulating layer formed over the second circuitry layer, a fifth insulating layer formed over the fourth surface of the semiconductor substrate and comprising the first insulating element, a sixth insulating layer formed over the fourth surface of the second semiconductor substrate with an intervention of the fifth insulating layer therebetween and comprising the second insulating element, and a front electrode formed over aside of the third surface of the second semiconductor substrate and coupled to the first penetration electrode of the first semiconductor chip.

According to the device of the present invention, warpage occurred in the semiconductor chip during the thermocompression-bonding is suppressed. Due to the prevention of warpage resulting from the thermocompression-bonding, the electrical connectivity between the semiconductor chips can be enhanced and it leads to increase the yield of the semiconductor device.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Figure 1:
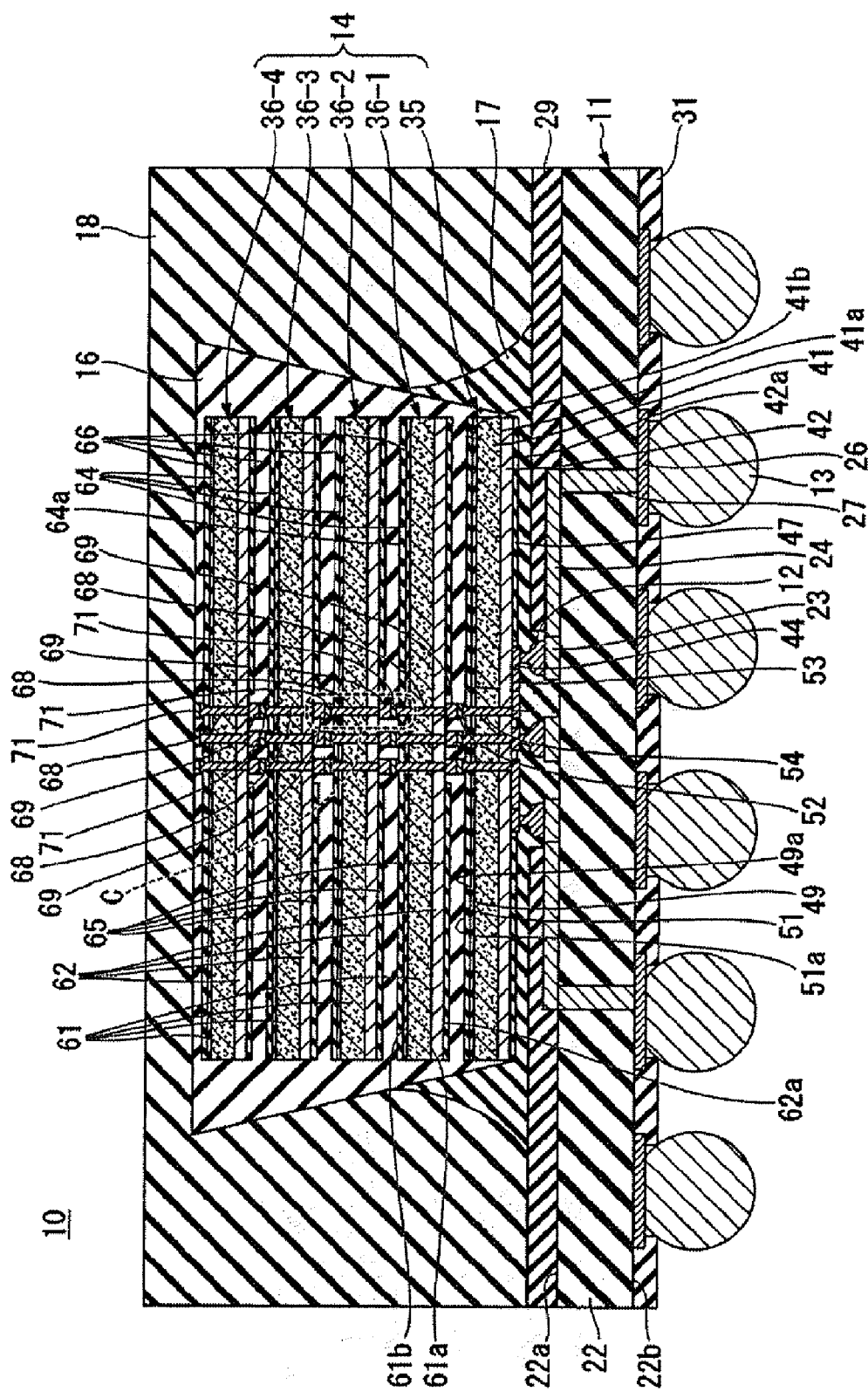
FIG. 1 is a cross-sectional view showing a schematic configuration of a semiconductor device according to an embodiment of the present invention.

An embodiment to which the present invention is applied is explained below in detail with reference to the accompanying drawings. The drawings used for the following descriptions only explain a configuration of the embodiment of the present invention, and the size, thickness, or dimension of respective elements shown in the drawings may differ from dimensional relationships in an actual semiconductor device.

Embodiment

Figure 2:
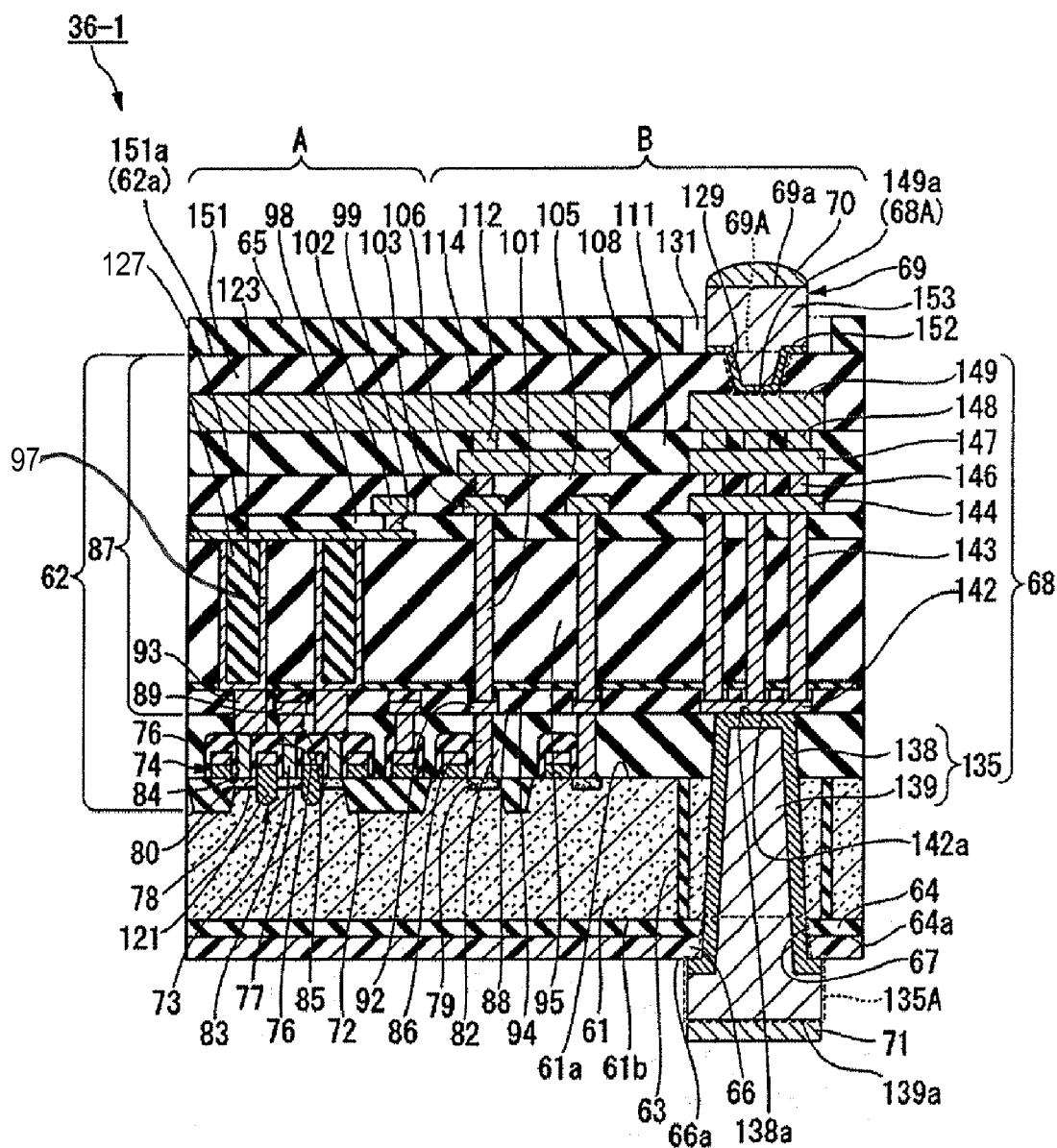
FIG. 2 is a cross-sectional view enlargedly showing a main part of a second semiconductor chip shown in FIG. 1.

Referring now to FIGS. 1 and 2, a penetration electrode 68 practically having a complicated configuration explained later is simplified. While practically having a complicated configuration as the penetration electrode 68, a penetration electrode 54 shown in FIG. 1 is also simplified. A solder bump 70 shown in FIG. 2 explained later is omitted in FIG. 1.

With reference to FIG. 1, a semiconductor device 10 according to the present embodiment has a wiring substrate 11, bumps 12, external connection terminals 13, a chip stacked body 14, a first sealing resin 16, a second sealing resin 17, and a third sealing resin 18.

The wiring substrate 11 has a substrate body 22, connection pads 23, wirings 24, connection lands 26, through silicon vias 27, a first solder mask 29, and a second solder mask 31. The substrate body 22 is plate-like with a front surface 22a and aback surface 22b which are both flat surfaces. For example, a glass epoxy substrate can be used for the substrate body 22.

The connection pads 23 are provided in the center of the front surface 22a of the substrate body 22. The wiring 24 is redistribution and is provided on the front surface 22a of the substrate body 22. The wiring 24 is connected to the connection pads 23.

The connection lands 26 are provided on the back surface 22b of the substrate body 22. The through silicon via 27 penetrates the substrate body 22 between the wiring 24 and the connection lands 26. One end of the through silicon via 27 is connected to the wiring 24 and the other end thereof is connected to the connection lands 26. Accordingly, the through silicon via 27 electrically connects the connection pads 23 and the connection lands 26 with each other.

The first solder mask 29 is provided on the front surface 22a of the substrate body 22. The first solder mask 29 exposes the connection pads 23 and covers the wiring 24. The first solder mask 29 protects the wiring 24. The second solder mask 31 is provided on the back surface 22b of the substrate body 22. The second solder mask 31 exposes the connection lands 26.

The bumps 12 are provided on the connection pads 23. The bumps 12 are connected to the chip stacked body 14 mounted on the wiring substrate 11 and to the wiring substrate 11, thereby electrically connecting the chip stacked body 14 and the wiring substrate 11 with each other. A stud bump (the material thereof is gold, for example) can be used for the bump 12.

The external connection terminals 13 are provided on the connection lands 26. When the semiconductor device 10 is mounted on a mounting board such as a motherboard (not shown), the external connection terminals 13 are connected to a terminal (not shown) provided on the mounting board. For example, solder balls can be used as the external connection terminals 13.

The chip stacked body 14 has a first semiconductor chip 35 and second semiconductor chips 36-1, 36-2, 36-3, and 36-4. The chip stacked body 14 has a configuration in which the second semiconductor chips 36-1, 36-2, 36-3, and 36-4 are stacked in this order on the first semiconductor chip 35 and is mounted on the wiring substrate 11.

The first semiconductor chip 35 is an IF (interface) semiconductor chip mounted on the wiring substrate 11 and has a semiconductor substrate 41, a circuit element layer 42, a first front electrode 44, a first front insulating layer 47, a second front insulating layer (not shown), a first back insulating layer 49, a second back insulating layer 51, a first back electrode 52, a wiring 53, and the penetration electrode 54.

Turning to FIG. 2, same constituent elements as those of the second semiconductor chip 36-1 shown in FIG. 1 are denoted by same references. In FIG. 2, a case in which a DRAM (Dynamic Random Access Memory) is used as an example of the second semiconductor chip 36-1 is shown. While only one penetration electrode 68 is shown in FIG. 2, practically a plurality of the penetration electrodes 68 are adjacently arranged at a predetermined interval.

With reference to FIGS. 1 and 2, a semiconductor substrate 61 is rectangular. The semiconductor substrate 61 has a first surface 61a and a second surface 61b located on a side opposite to the first surface 61a. A groove 121 in which a gate dielectric film (not shown) and a part of a gate electrode 73 are arranged is formed on the side of the first surface 61a of the semiconductor substrate 61. The groove 121 is located in a memory cell formation area A. A monocrystalline silicon substrate can be used for the semiconductor substrate 61, for example.

A circuit element layer 62 is provided on the first surface 61a of the semiconductor substrate 61. With reference to FIG. 2, the circuit element layer 62 has the memory cell formation area A in which memory cells are formed and a peripheral circuit area B in which peripheral circuits are formed, and also has an element insulation area 72, a gate oxide film (not shown) formed on the first surface 61a of the semiconductor substrate 61, gate electrodes 73 and 74, aside wall 76, a first impurity diffused layer 77, a second impurity diffused layer 78, a third impurity diffused layer 79, a transistor 80, a first interlayer dielectric film 82, self-aligned contacts 83 and 84, a bit-line contact 85, a contact plug 86, and a multi-level wiring structure 87.

With reference to FIG. 2, the multi-level wiring structure 87 has a second interlayer dielectric film 88, a bit line 89, a plurality of wiring layers including wiring layers 92, 102, 103, 108, 114, 142, 144, and 147, and a first wiring layer 149, a capacitive contact 93, a stopper film 94, a third interlayer dielectric film 95, a capacitor 97 serving as a memory element, a fourth interlayer dielectric film 98, vias 99, 106, 112, 146, and 148, contact plugs 101 and 143, a fifth interlayer dielectric film 105, a sixth interlayer dielectric film 111, and a second front insulating layer 151. Among these elements, the wiring layers 142, 144, and 147, the contact plugs 143, the vias 146 and 148, and the first wiring layer 149 constitute a part of the penetration electrode 68.

The second interlayer dielectric film 88 is provided on the first interlayer dielectric film 82. The second interlayer dielectric film 88 is located in the memory cell formation area A and the peripheral circuit area B. A silicon dioxide film (an SiO₂ film) can be used for the second interlayer dielectric film 88, for example.

The stopper film 94 is provided on the second interlayer dielectric film 88. The stopper film 94 is located in the memory cell formation area A and the peripheral circuit area B. The stopper film 94 serves as an etching stopper when a cylinder hole 123 for arranging the capacitor 97 in the third interlayer dielectric film 95 is formed by etching. A silicon nitride film (an SiN film) is used for the stopper film 94.

The third interlayer dielectric film 95 is provided on the stopper film 94 and has the cylinder hole 123 that exposes an upper surface of the capacitive contact 93. The cylinder hole 123 penetrates the third interlayer dielectric film 95. The third interlayer dielectric film 95 is located in the memory cell formation area A and the peripheral circuit area B. A silicon dioxide film (an SiO₂ film) can be used for the third interlayer dielectric film 95.

The fourth interlayer dielectric film 98 is provided on the third interlayer dielectric film 95 to cover an upper electrode 127. The fourth interlayer dielectric film 98 is located in the memory cell formation area A and the peripheral circuit area B. A silicon dioxide film (an SiO₂ film) can be used for the fourth interlayer dielectric film 98, for example.

The fifth interlayer dielectric film 105 is provided on the fourth interlayer dielectric film 98 to cover the wiring layers 102 and 103. The fifth interlayer dielectric film 105 is located in the memory cell formation area A and the periph- eral circuit area B. A silicon dioxide film (an SiO₂ film) can be used for the fifth interlayer dielectric film 105, for example.

The sixth interlayer dielectric film 111 is provided on the fifth interlayer dielectric film 105 to cover the wiring layer 108. The sixth interlayer dielectric film 111 is located in the memory cell formation area A and the peripheral circuit area B. A silicon dioxide film (an SiO₂ film) can be used for the sixth interlayer dielectric film 111, for example.

The wiring layer 142 is provided on the first interlayer dielectric film 82 provided in the peripheral circuit area B. A part of a lower surface 142a of the wiring layer 142 is exposed through a substrate through hole 67. The lower surface 142a of the wiring layer 142 is connected to an upper surface 138a of a seed layer 138 provided in the substrate through hole 67. Accordingly, the wiring layer 142 is electrically connected to a through silicon via 135.

The contact plugs 143 penetrate the second interlayer dielectric film 88, the stopper film 94, the third interlayer dielectric film 95, and the fourth interlayer dielectric film 98 located on the wiring layer 142. Lower ends of the contact plugs 143 are connected to an upper surface of the wiring layer 142. Accordingly, the contact plugs 143 are electrically connected to the wiring layer 142.

The wiring layer 144 is provided on an upper surface of the fourth interlayer dielectric film 98 located in the peripheral circuit area B. The wiring layer 144 has a lower surface connected to upper ends of the contact plugs 143. Accordingly, the wiring layer 144 is electrically connected to the contact plugs 143. The vias 146 penetrate the fifth interlayer dielectric film 105 located on the wiring layer 144. The vias 146 have lower ends connected to the wiring layer 144. Accordingly, the vias 146 are electrically connected to the wiring layer 144.

The wiring layer 147 is provided on an upper surface of the fifth interlayer dielectric film 105 located in the peripheral circuit area B. The wiring layer 147 has a lower surface connected to upper ends of the vias 146. Accordingly, the wiring layer 147 is electrically connected to the vias 146. With reference to FIG. 2, the vias 148 penetrate the sixth interlayer dielectric film 111 located on the wiring layer 147. The vias 148 have lower ends connected to the wiring layer 147. Accordingly, the vias 148 are electrically connected to the wiring layer 147.

The first wiring layer 149 is provided on an upper surface of the sixth interlayer dielectric film 111 located in the peripheral circuit area B. The first wiring layer 149 has a lower surface connected to upper ends of the vias 148. Accordingly, the first wiring layer 149 is electrically connected to the vias 148. A part of an upper surface 149a of the first wiring layer 149 (an end 68A of the penetration electrode 68) is exposed through an opening 129 formed in the second front insulating layer 151. The first wiring layer 149 is arranged uppermost among the wiring layers constituting the multi-level wiring structure 87.

The second front insulating layer 151 is provided on the sixth interlayer dielectric film 111 to cover the first wiring layer 149. The second front insulating layer 151 has the opening 129 that exposes the end 68A of the penetration electrode 68. The second front insulating layer 151 protects apart of the multi-level wiring structure 87 arranged beneath the second front insulating layer 151. Specifically, the second front insulating layer 151 prevents water from entering the part of the multi-level wiring structure 87 arranged beneath the second front insulating layer 151. For example, a silicon nitride film (an Si₃N₄ film), a silicon oxynitride film (an SiON film) or the like can be used for the second front insulating layer 151.

A cylindrical insulator 63 (an insulating ring) is provided in the semiconductor substrate 61 to surround an outer circumference of the through silicon via 135 that constitutes the penetration electrode 68. The cylindrical insulator 63 penetrates the semiconductor substrate 61 located in the peripheral circuit area B. The cylindrical insulator 63 is formed by embedding a groove formed in the semiconductor substrate 61 with an insulating film (a silicon nitride film (Si₃N₄ film), a silicon dioxide film (SiO₂ film) or the like). While a case in which one cylindrical insulator 63 is provided for one penetration electrode 68 is shown in FIG. 2, two cylindrical insulators can be concentrically arranged for one penetration electrode 68.

With reference to FIGS. 1 and 2, a first back insulating layer 64 (the second or fifth insulating layers) covers the second surface 61b of the semiconductor substrate 61. A silicon nitride film (an Si₃N₄ film) can be used for the first back insulating layer 64, for example.

A first front insulating layer 65 (the first or fourth insulating layers) is provided on a front surface 151a of the second front insulating layer 151 (a first surface of the second front insulating layer 151 (a front surface 62a of the circuit element layer 62)). The first front insulating layer 65 has an opening 131 that exposes a second front electrode 69. The first front insulating layer 65 includes an insulating material different from that of the second front insulating layer 151. For example, a polyimide resin can be used for the first front insulating layer 65. The first front insulating layer 65 can be 3-μm thick, for example.

A second back insulating layer 66 (the third or sixth insulating layers) covers a front surface 64a of the first back insulating layer 64 (a surface opposite to a surface of the first back insulating layer 64 contacting with the semiconductor substrate 61). The first front insulating layer 65 and the second back insulating layer 66 include resin. Specifically, the first front insulating layer 65 and the second back insulating layer 66 include thermosetting resin.

For the second back insulating layer 66, an insulating layer (a resin layer) having such a thermal expansion coefficient that a difference in thermal expansion coefficients between the second back insulating layer 66 and the first front insulating layer 65 is smaller than a difference in thermal expansion coefficients between the first back insulating layer 64 and the first front insulating layer 65 is used.

As described above, by providing on the front surface 64a of the first back insulating layer 64, the second back insulating layer 66 having such a thermal expansion coefficient that a difference in thermal expansion coefficient between the first front insulating layer 65 and the second back insulating layer 66 is smaller than a difference in thermal expansion coefficients between the first back insulating layer 64 and the first front insulating layer 65, a difference in thermal expansion coefficients between front and back surface sides of the second semiconductor chip 36-1 can be reduced as compared to conventional techniques. Accordingly, the occurrence of warpage in the second semiconductor chip 36-1 due to heating performed when the first back electrode 52 of the first semiconductor chip 35 and the second front electrode 69 of the second semiconductor chip 36-1 are thermocompression-bonded or when a second back electrode 71 of the second semiconductor chip 36-1 and the second front electrode 69 of the second semiconductor chip 36-2 are thermocompression-bonded can be suppressed.

Because warpage in the first and second semiconductor chips 35 and 36-1 due to heating or cooling at the time of thermocompression bonding can be suppressed, reliability in electrical connection between the first semiconductor chip 35 and the second semiconductor chip 36-1 can be increased. When the first front insulating layer 65 is 3-μm thick, the second back insulating layer 66 can be 3-μm thick, for example.

With reference to FIG. 2, the substrate through hole 67 penetrates the semiconductor substrate 61 surrounded by the cylindrical insulator 63, the first back insulating layer 64 facing the semiconductor substrate 61 surrounded by the cylindrical insulator 63, the second back insulating layer 66, and the first interlayer dielectric film 82.

With reference to FIGS. 1 and 2, the penetration electrode 68 penetrates the semiconductor substrate 61, the first back insulating layer 64, and the second back insulating layer 66. An end of the penetration electrode 68 is exposed through the second back insulating layer 66 and protrudes from a front surface 66a of the second back insulating layer 66, and a part of the other end thereof is exposed through the opening 129.

The penetration electrode 68 has the through silicon via 135 (Si through silicon via), the wiring layers 142, 144, and 147 electrically connected to the through silicon via 135, the contact plugs 143, the vias 146 and 148, and the first wiring layer 149.

With reference to FIG. 2, the through silicon via 135 has the seed layer 138 and a through silicon via body 139. The seed layer 138 covers an internal surface of the substrate through hole 67 and the front surface 66a of the second back insulating layer 66 located in a formation area of the through silicon via body 139. The upper surface 138a of the seed layer 138 (one end of the through silicon via 135) is exposed through the first interlayer dielectric film 82. A laminated film formed by sequentially laminating a Ti film and a Cu film can be used for the seed layer 138, for example.

The through silicon via body 139 is an Si through silicon via (TSV), and fills the substrate through hole 67 with the seed layer 138 interposed therebetween. The through silicon via body 139 is made of a metallic material (specifically, Cu). The through silicon via 135 includes an end portion 135A protruding from the second surface 61b of the semiconductor substrate 61, and a part of the first back insulating layer 64 and a part of the second back insulating layer 66 are inserted between the second surface 61b of the semiconductor substrate 61 and the end portion 135A of the through silicon via 135.

By inserting a part of the first back insulating layer 64 and a part of the second back insulating layer 66 between the second surface 61b of the semiconductor substrate 61 and the end portion 135A of the through silicon via 135, a parasitic capacitance of the through silicon via 135 can be reduced. This is effective particularly when only one cylindrical insulator 63 can be provided (when a plurality of the cylindrical insulators cannot be provided) for one through silicon via 135 because of the progress in downscaling of the semiconductor device 10, as shown in FIG. 2.

With reference to FIG. 2, the second front electrode 69 has a seed layer 152 and a front electrode body 153. The seed layer 152 is provided on inner surfaces (side and bottom surfaces) of the opening 129 and on the front surface 151a of the second front insulating layer 151 (the first surface of the second front insulating layer 151) corresponding to a formation area of the front electrode body 153. The seed layer 152 provided on the bottom surface of the opening 129 is connected to the upper surface 149a of the first wiring layer 149. Accordingly, the second front electrode 69 is electrically connected to the penetration electrode 68. A laminated film formed by sequentially laminating a Ti film and a Cu film can be used for the seed layer 152, for example.

The front electrode body 153 fills the opening 129 with the seed layer 152 interposed therebetween. The front electrode body 153 has a form to protrude from a front surface of the first front insulating layer 65. For example, Cu can be used for a material of the front electrode body 153.

The second front electrode 69 has a first portion 69A that penetrates the second front insulating layer 151 to reach the first wiring layer 149. Any one of the plural wiring layers that constitute the multi-level wiring structure 87 is not inserted between the first wiring layer 149 and the second front electrode 69.

With reference to FIG. 1, the second front electrode 69 of the second semiconductor chip 36-1 is connected to the first back electrode 52 of the first semiconductor chip 35. Accordingly, the second semiconductor chip 36-1 is electrically connected to the first semiconductor chip 35 and is also electrically connected to the wiring substrate 11 via the first semiconductor chip 35. A clearance is formed between the first semiconductor chip 35 and the second semiconductor chip 36-1.

With reference to FIG. 2, the solder bump 70 covers an upper surface 69a of the second front electrode 69. For example, an Sn—Ag alloy can be used as a material of the solder bump 70. The second back electrode 71 covers an end face 139a of the through silicon via body 139 (the other end of the penetration electrode 68) exposed through the second back insulating layer 66. That is, the second back electrode 71 is located on the side of the second surface 61b of the semiconductor substrate 61. For example, an Ni/Au laminated film formed by sequentially laminating an Ni layer and an Au layer can be used for the second back electrode 71.

The second semiconductor chip 36-1 is thinned (50 µm or thinner, for example) to have the through silicon via 135 that penetrates the semiconductor substrate 61. While the DRAM is explained as an example of the second semiconductor chip 36-1 in FIG. 2, an SRAM (Static Random Access Memory), a PRAM (phase change RAM), a flash memory or the like can be used instead of the DRAM.

With reference to FIG. 1, the second semiconductor chip 36-2 is a thinned (50 µm or thinner, for example) semiconductor chip with the same configuration as that of the second semiconductor chip 36-1 and is mounted on the second semiconductor chip 36-1.

Figure 3:
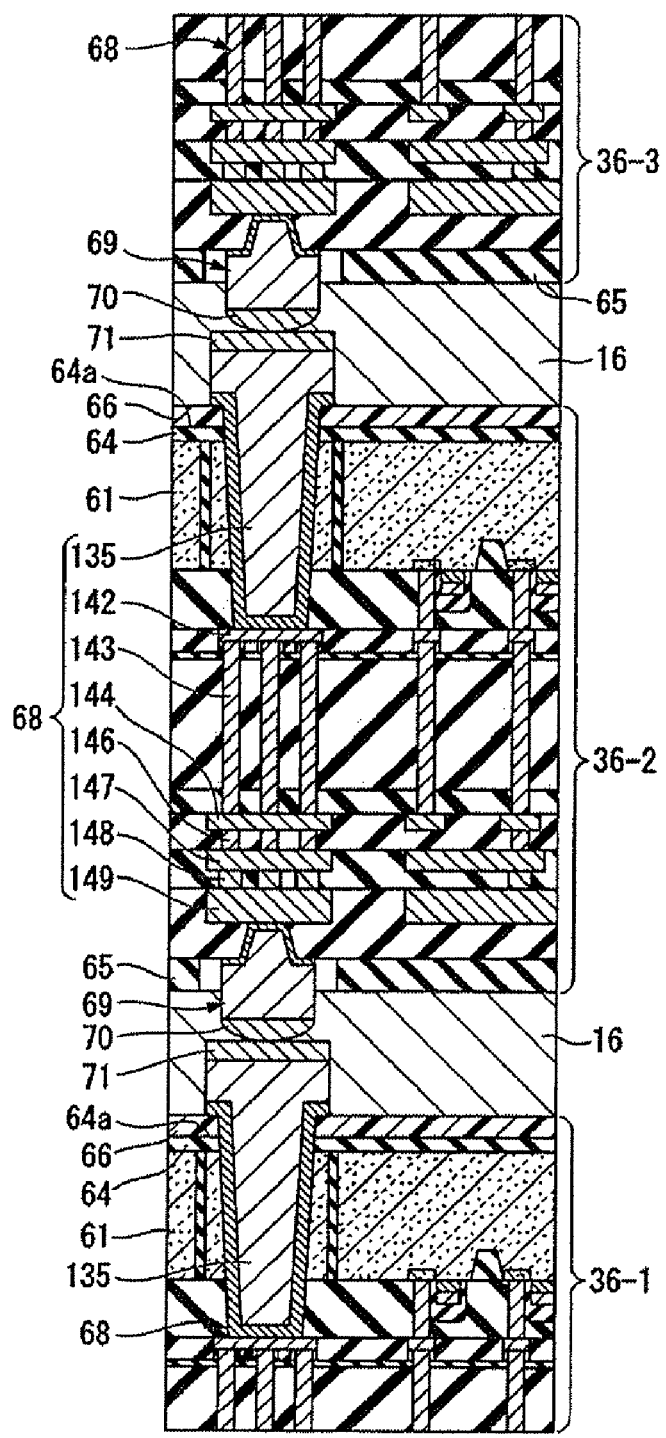
FIG. 3 is a cross-sectional view enlargedly showing a chip stacked body corresponding to an area C shown in FIG. 1.

FIG. 3 is a cross-sectional view enlargedly showing a chip stacked body corresponding to an area C shown in FIG. 1. In FIG. 3, constituent elements identical to those in the semiconductor device 10 shown in FIG. 1 and those in the second semiconductor chip 36-1 are denoted by like reference characters.

With reference to FIG. 3, the second front electrode 69 of the second semiconductor chip 36-2 is electrically connected to the second back electrode 71 of the second semiconductor chip 36-1 via the solder bump 70. Accordingly, the second semiconductor chip 36-2 is mounted on the second semiconductor chip 36-1 and is electrically connected to the wiring substrate 11. A clearance in which the first sealing resin 16 is to be filled is formed between the second semiconductor chips 36-1 and 36-2.

Because the second semiconductor chip 36-2 has the same configuration as that of the second semiconductor chip 36-1, the second semiconductor chip 36-2 has on the front surface 64a of the first back insulating layer 64, the second back insulating layer 66 having such a thermal expansion coefficient that a difference in thermal expansion coefficients between the first front insulating layer 65 and the second back insulating layer 66 is smaller than a difference in thermal expansion coefficients between the first back insulating layer 64 and the first front insulating layer 65. Accordingly, a difference in thermal expansion coefficients between the front and back surface sides of the second semiconductor chip 36-2 can be reduced as compared to conventional techniques. Therefore, this suppresses the occurrence of warpage in the second semiconductor chip 36-2 due to heating performed when the second semiconductor chips 36-1 and 36-2 are thermocompression-bonded or when the second semiconductor chip 36-2 and 36-3 are thermocompression-bonded.

Because warpage in the first and second semiconductor chips 35, 36-1, and 36-2 caused by heating or cooling at the time of thermocompression bonding can be suppressed, reliability in electrical connection between the second semiconductor chip 36-2 and the first and second semiconductor chips 35 and 36-1 can be enhanced.

Because the second semiconductor chips 36-3 and 36-4 also have substantially the same configuration as that of the second semiconductor chip 36-1, detailed explanations thereof will be omitted.

With reference to FIG. 1, the first sealing resin 16 fills the clearance formed between the first semiconductor chip 35 and the second semiconductor chip 36-1 and clearances formed between the second semiconductor chips 36-1, 36-2, 36-3, and 36-4, respectively, and covers a peripheral side surface of the chip stacked body 14.

The first sealing resin 16 provided on the side surface of the chip stacked body 14 has an inverse tapered shape that becomes smaller in width from a position of the second semiconductor chip 36-4 located uppermost toward a position of the first semiconductor chip 35 located lowermost. The first sealing resin 16 protects the stacked first and second semiconductor chips 35, 36-1, 36-2, 36-3, and 36-4. An underfill resin can be used for the first sealing resin 16, for example.

The second sealing resin 17 fills a clearance formed between the first semiconductor chip 35 and the wiring substrate 11. The second sealing resin 17 covers a part of a side surface of the first sealing resin 16 located on the side of the wiring substrate 11. The second sealing resin protects electrical connection between the first semiconductor chip 35 and the wiring substrate 11. An underfill resin can be used for the second sealing resin 17, for example.

The third sealing resin 18 is provided on the side of the upper surface of the wiring substrate 11 (on the side of the front surface 22a of the substrate body 22) to seal the chip stacked body 14, the first sealing resin 16, and the second sealing resin 17. A molding resin can be used for the third sealing resin 18, for example.

The semiconductor device of the present embodiment has the chip stacked body 14 including the first and second semiconductor chips 35, 36-1, 36-2, 36-3, and 36-4 stacked one on top of another, each of the first and second semiconductor chips 35, 36-1, 36-2, 36-3, and 36-4 having the semiconductor substrate 41 or 61, the circuit element layer 42 or 62 provided on a first surface 41a or 61a of the semiconductor substrate 41 or 61, the first front insulating layer 47 or 65 provided on a front surface 42a or 62a of the circuit element layer 42 or 62, the first back insulating layer 49 or 64 provided on a second surface 41b or 61b of the semiconductor substrate 41 or 61, the second back insulating layer 51 or 66 provided on a front surface 49a or 64a of the first back insulating layer 49 or 64 located on the side opposite to the surface contacting with the semiconductor substrate 41 or 61 and including the insulating material different from the first back insulating layer 49 or 64, and the through silicon via 135 that penetrates the semiconductor substrate 41 or 61. Therefore, a difference in thermal expansion coefficients between the front and back surface sides of each of the first and second semiconductor chips 35, 36-1, 36-2, 36-3, and 36-4 can be reduced as compared to conventional techniques.

Accordingly, the occurrence of warpage in the first and second semiconductor chips 35, 36-1, 36-2, 36-3, and 36-4 due to heating performed when the wiring substrate 11, the first semiconductor chip 35, and the second semiconductor chips 36-1, 36-2, 36-3, and 36-4 are thermocompression-bonded can be suppressed.

When warpage in the first and second semiconductor chips 35, 36-1, 36-2, 36-3, and 36-4 resulting from heating or cooling at the time of thermocompression bonding can be suppressed, reliability in electrical connection between the first and second semiconductor chips 35, 36-1, 36-2, 36-3, and 36-4 can be enhanced, which increases the yield of the semiconductor device 10.

A manufacturing process of the second semiconductor chip according to the present invention is explained next with reference to FIGS. 4 to 8. FIGS. 4 to 8 are cross-sectional views showing parts of a manufacturing process of the semiconductor device according to the embodiment of the present invention. A cut surface of the second semiconductor chip 36-1 shown in FIGS. 4 to 8 corresponds to a cut surface of the second semiconductor chip 36-1 shown in FIG. 2.

Figure 4:
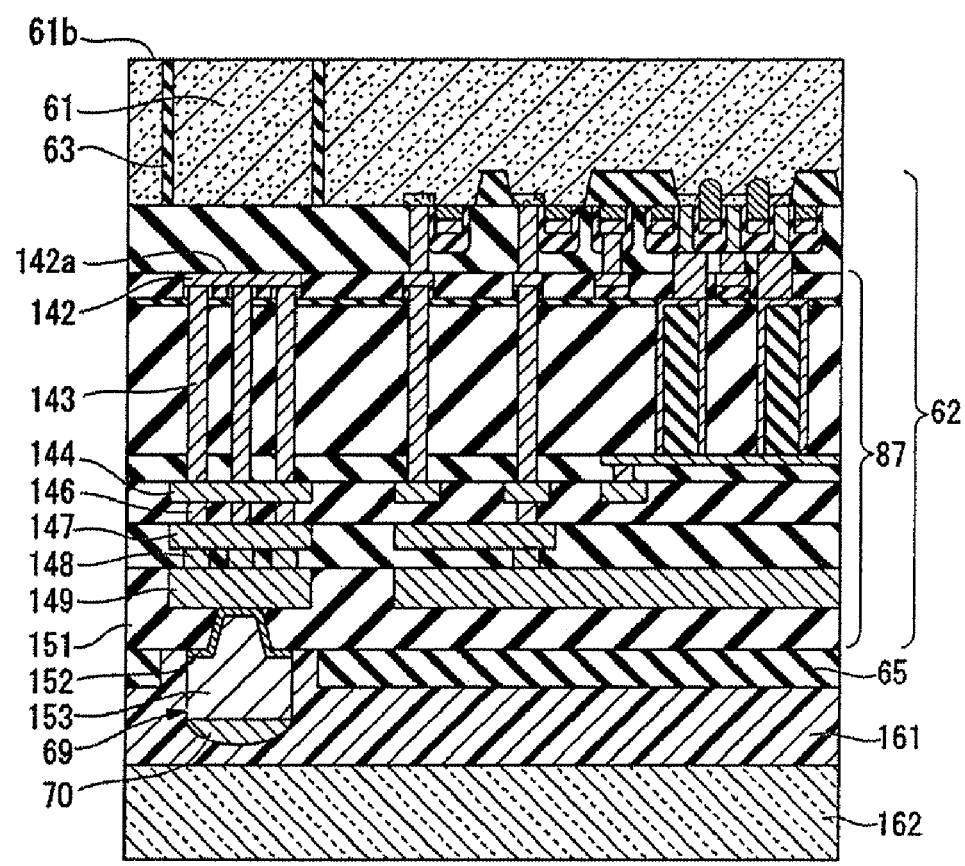
FIG. 4 is a first cross-sectional view showing a manufacturing process of the semiconductor device according to the embodiment of the present invention, in which a manufacturing process of the second semiconductor chip included in the semiconductor device according to the embodiment is shown.

A cross-sectional view of FIG. 4 shows a state obtained by forming the constituent elements of the second semiconductor chip 36-1 shown in FIG. 2 on the front surface side of the semiconductor substrate 61 and the cylindrical insulator 63 in the semiconductor substrate 61, then attaching a support substrate 162 on the side of the second front electrode 69 through an adhesive 161, and thinning the semiconductor substrate 61.

Thinning of the semiconductor substrate 61 is achieved by polishing or grinding the semiconductor substrate 61 from the second surface side of the semiconductor substrate 61.

Figure 5:
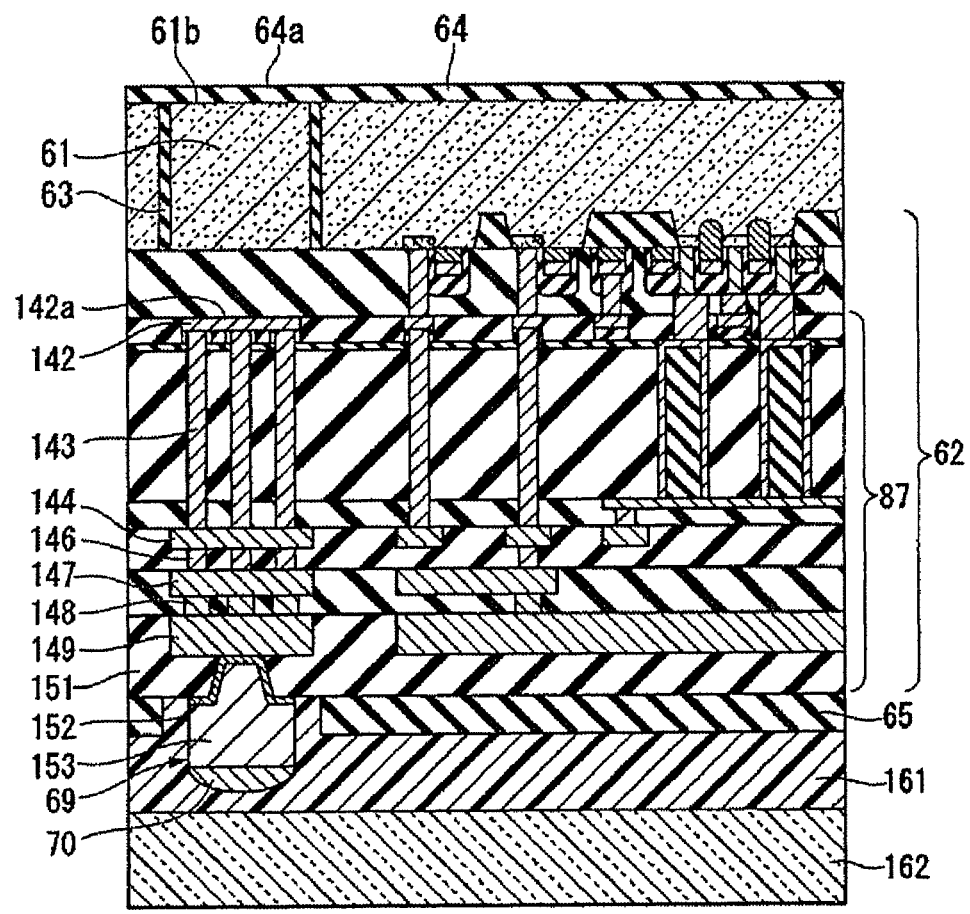
FIG. 5 is a second cross-sectional view showing a manufacturing process of the semiconductor device according to the embodiment of the present invention, in which a manufacturing process of the second semiconductor chip included in the semiconductor device according to the embodiment is shown.

Next, in a process shown in FIG. 5, the first back insulating layer 64 that covers the second surface 61b of the semiconductor substrate 61 and the end face of the cylindrical insulator 63 is formed. Specifically, a silicon nitride film (an SiN film) is formed as the first back insulating layer 64 by a CVD method, for example.

Figure 6:
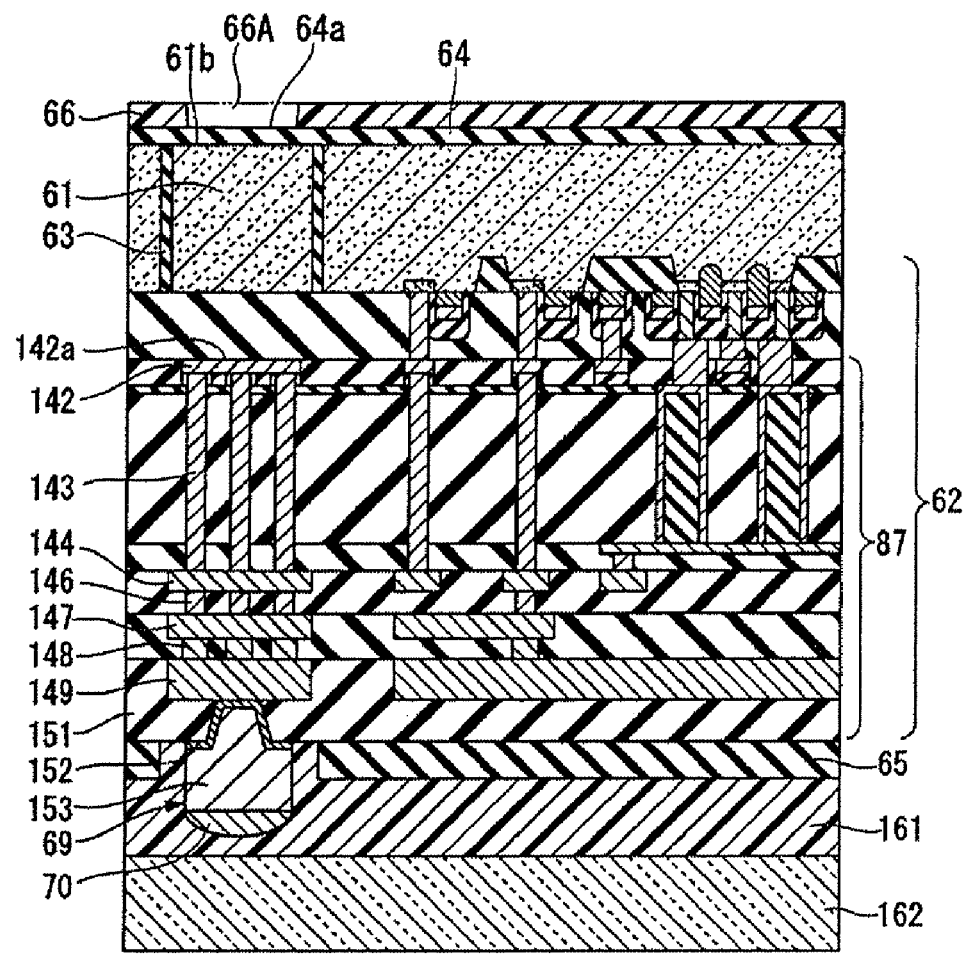
FIG. 6 is a third cross-sectional view showing a manufacturing process of the semiconductor device according to the embodiment of the present invention, in which a manufacturing process of the second semiconductor chip included in the semiconductor device according to the embodiment is shown.

Next, in a process shown in FIG. 6, the second back insulating layer 66 having an opening 66A that exposes the front surface 64a of the first back insulating layer 64 corresponding to the formation area of the penetration electrode 68 (specifically, the through silicon via body 139) shown in FIG. 2 is formed on the front surface 64a of the first back insulating layer 64. The second back insulating layer 66 includes an insulating material different from the first back insulating layer 64. The first front insulating layer 65, the first back insulating layer 64, and the second back insulating layer 66 are formed to have a difference in thermal expansion coefficients between the second back insulating layer 66 and the first front insulating layer 65 that is smaller than a difference in thermal expansion coefficients between the first back insulating layer 64 and the first front insulating layer 65. A thermosetting resin is used as a material of the second back insulating layer 66, and it is preferable that, when a thermosetting adhesive is used as the adhesive 161, a thermosetting resin to be used as a base material of the second back insulating layer 66 have a thermal curing temperature lower than that of the thermosetting adhesive.

Figure 7:
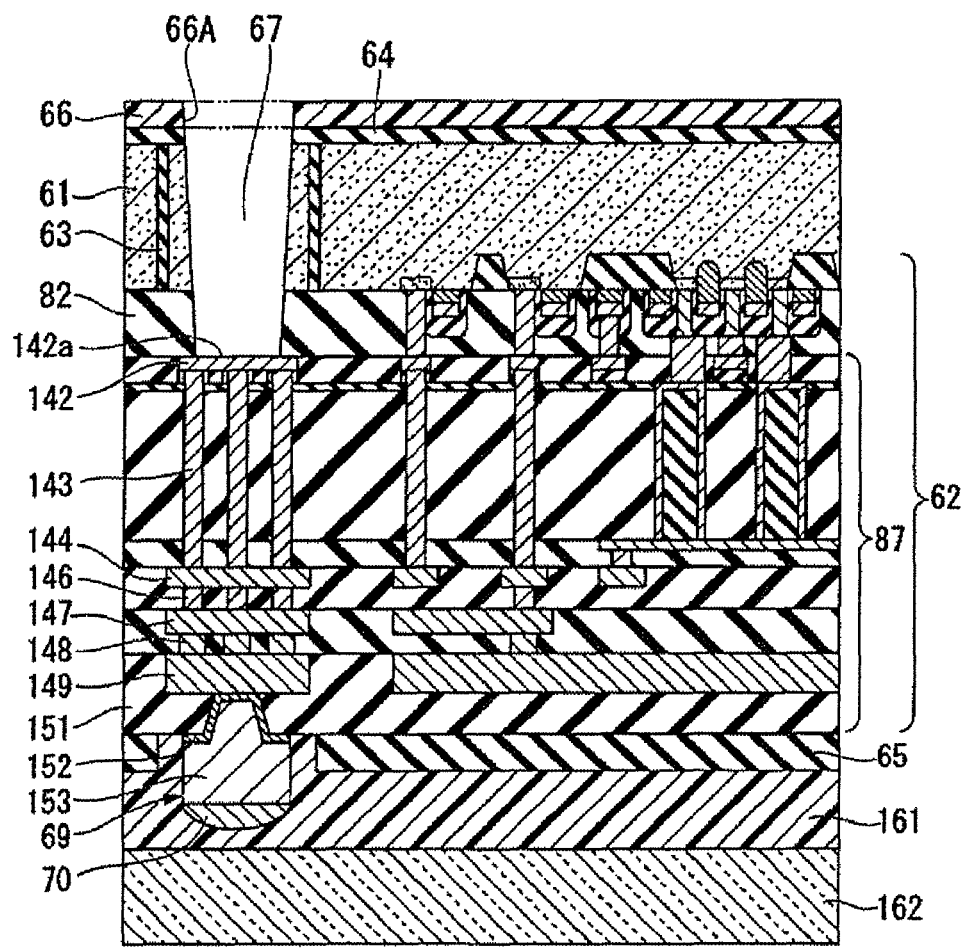
FIG. 7 is a fourth cross-sectional view showing a manufacturing process of the semiconductor device according to the embodiment of the present invention, in which a manufacturing process of the second semiconductor chip included in the semiconductor device according to the embodiment is shown.

Next, in a process shown in FIG. 7, anisotropic etching (dry etching, for example) is performed using the second back insulating layer 66 having the opening 66A as a mask to etch the first back insulating layer 64, the semiconductor substrate 61, and the first interlayer dielectric film 82 located below the opening 66A, thereby exposing the lower surface 142a of the wiring layer 142 and forming the substrate through hole 67 in which the through silicon via 135 is to be arranged.

That is, the second back insulating layer 66 functions as an etching mask when the substrate through hole 67 is formed. This utilization of the second back insulating layer 66 as the etching mask at the time of formation of the substrate through hole 67 eliminates the need to form a separate etching mask on the second back insulating layer 66, which can simplify the manufacturing process of the second semiconductor chip 36-1.

Figure 8:
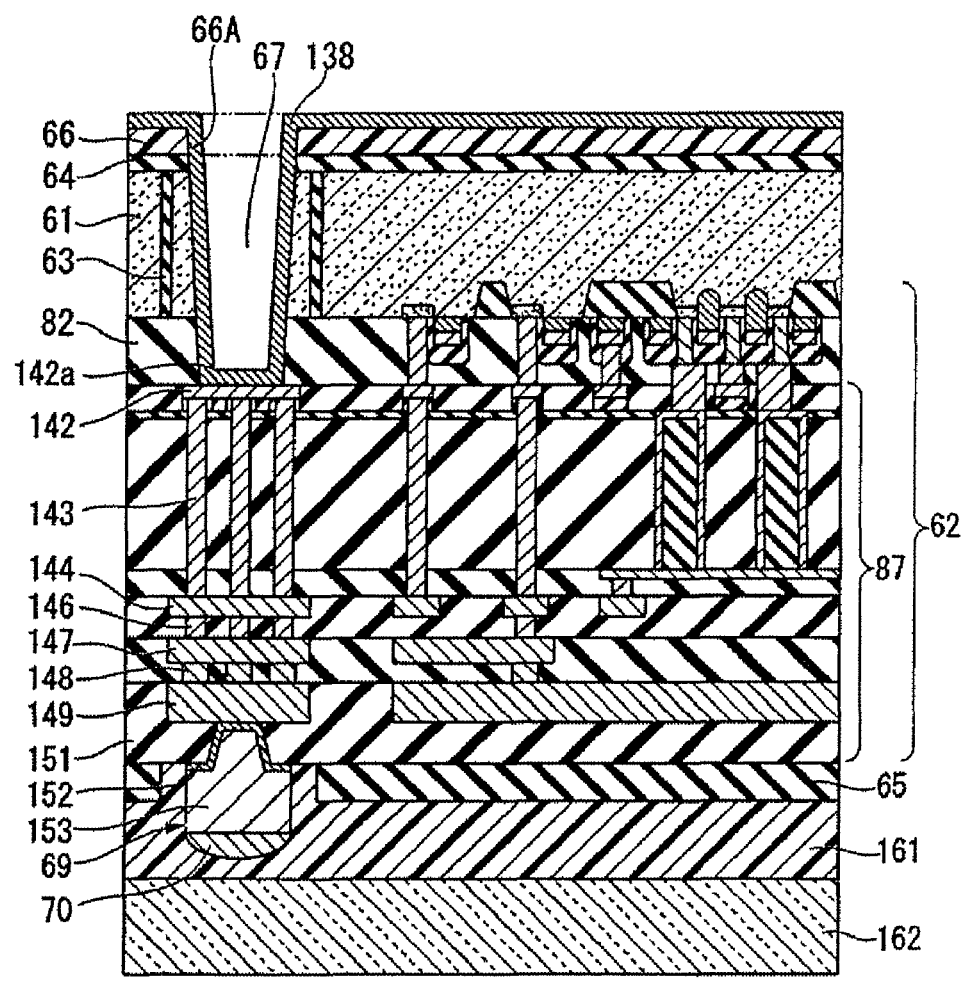
FIG. 8 is a fifth cross-sectional view showing a manufacturing process of the semiconductor device according to the embodiment of the present invention, in which a manufacturing process of the second semiconductor chip included in the semiconductor device according to the embodiment is shown.
Figure 9:
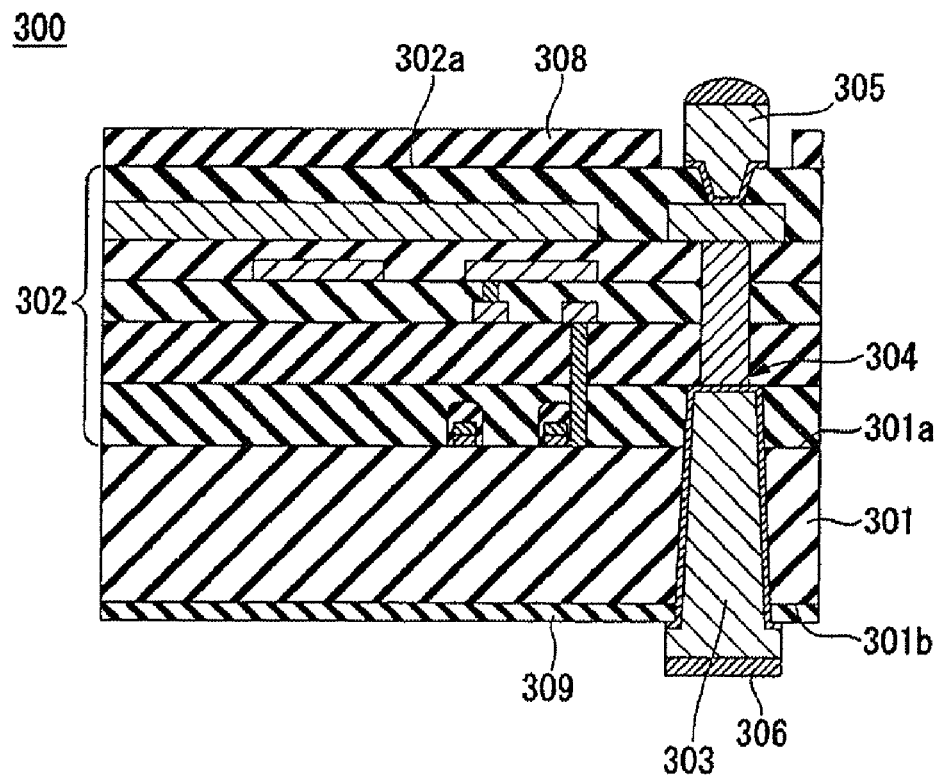
FIG. 9 is a cross-sectional view showing an example of a semiconductor chip having a through silicon via, which is applied to a conventional semiconductor device.

Next, in a process shown in FIG. 8, the seed layer 138 that covers an inner wall of the opening 66A and an inner surface of the substrate through hole 67 (including the lower surface 142a of the wiring layer 142 exposed through the substrate through hole 67) is formed by a spattering method. The seed layer 138 is a conductive layer to be used as a power supply layer when the through silicon via body 139 is formed by an electrolytic plating method. The seed layer 138 can be formed by a method other than the spattering method. A laminated film formed by sequentially laminating a Ti film (150-nm (nanometers) thick) and a Cu film (600-nm thick) can be used for the seed layer 138, for example.

The thickness of the seed layer 138 can be appropriately selected according to intended use and is not limited to the value mentioned above. It is preferable that the thickness of the seed layer 138 be larger than that of the seed layer 152 to be used when the front electrode body 153 is formed by the electrolytic plating method. Accordingly, the through silicon via body 139 having a larger volume than that of the front electrode body 153 can be securely embedded with a plating film.

The through silicon via body 139 is then formed by the electrolytic plating method using the seed layer 138 as a power supply layer. A solder plating film (a plating film made of an Sn—Ag alloy, for example) is then deposited on the end face 139a of the through silicon via body 139 by the electrolytic plating method to form the second back electrode 71, and then the adhesive 161 and the support substrate 162 are eliminated, so that the second semiconductor chip 36-1 according to the present embodiment is manufactured.

The second semiconductor chips 36-2, 36-3, and 36-4 shown in FIG. 1 can be manufactured by a similar method to that of the second semiconductor chip 36-1 explained above. The first front insulating layer 47, the first back insulating layer 49, and the second back insulating layer 51 constituting the first semiconductor chip 35 shown in FIG. 1 can be formed by a similar method to that of the first front insulating layer 65, the first back insulating layer 64, and the second back insulating layer 66 provided in the second semiconductor chip 36-1.

According to the manufacturing method of the semiconductor device of the present embodiment, the second back insulating layer 66 is used as an etching mask when the substrate through hole 67 is formed, thereby eliminating the need to form a separate etching mask on the second back insulating layer 66, which simplifies the manufacturing process of the second semiconductor chip 36-1.

While a preferred embodiment of the present invention has been explained in detail, the present invention is not limited to any specific embodiments, and various changes and modifications can be made within the scope of the present invention that is described in the claims.

INDUSTRIAL APPLICABILITY

The present invention can be applicable to a semiconductor device and a manufacturing method thereof.

What is claimed is:

1. A device comprising:
    a semiconductor substrate including first and second surfaces opposing to each other;
    a circuitry layer formed over the first surface of the semiconductor substrate;
    a first insulating layer formed over the circuitry layer;
    a second insulating layer formed over the second surface of the semiconductor substrate and comprising a first insulating element;
    a third insulating layer formed over the second surface of the semiconductor substrate with an intervention of the second insulating layer therebetween and comprising a second insulating element different from the first insulating element of the second insulating layer; wherein the third insulating layer substantially covers the second insulating layer;
    a penetration electrode penetrating through the semiconductor substrate, the circuitry layer, the second insulating layer and the third insulating layer;
    a cylindrical insulating ring in the semiconductor substrate surrounding the penetration electrode and isolated from the penetration electrode by the semiconductor substrate in a direction parallel to the first surface of the semiconductor substrate; and
    a front electrode coupled to the penetration electrode, wherein the first insulating layer includes an opening and the front electrode is exposed from the opening of the first insulating layer, the front electrode being spaced apart from the first insulating layer.

2. The device as claimed in claim 1, wherein a difference in thermal coefficient between the first and third insulating layers is smaller than a difference in thermal coefficient between the first and second insulating layers.

3. The device as claimed in claim 1, wherein the second insulating element includes thermosetting resin.

4. The device as claimed in claim 1, wherein the penetration electrode includes an end portion protruding from the third insulating layer, and a part of the second insulating layer and a part of the third insulating layer are sandwiched between the second surface of the semiconductor substrate and the end portion of the penetration electrode.

5. The device as claimed in claim 1, wherein the first insulating layer includes a polyimide resin.

6. The device as claimed in claim 5, wherein the second insulating element includes thermosetting resin.

7. The device as claimed in claim 6, wherein the first insulating element includes a silicon nitride.

8. A device comprising:
    a first semiconductor chip including:
        a first semiconductor substrate including first and second surfaces opposing to each other;
        a first circuitry layer formed over the first surface of the semiconductor substrate;
        a first insulating layer formed over the first circuitry layer;
        a second insulating layer formed over the second surface of the semiconductor substrate and comprising a first insulating element;
        a third insulating layer formed over the second surface of the first semiconductor substrate with an intervention of the second insulating layer therebetween and comprising a second insulating element different from the first insulating element of the second insulating layer;
        a first penetration electrode penetrating through the first semiconductor substrate, the first circuitry layer, the second insulating layer and the third insulating layer; and
        a cylindrical insulating ring in the semiconductor substrate surrounding the penetration electrode and isolated from the penetration electrode by the semiconductor substrate in a direction parallel to the first surface of the semiconductor substrate; and
    a second semiconductor chip stacked with the first semiconductor chip, the second semiconductor chip including:
        a second semiconductor substrate including third and fourth surfaces opposing to each other;
        a second circuitry layer formed over the third surface of the semiconductor substrate;
        a fourth insulating layer formed over the second circuitry layer;
        a fifth insulating layer formed over the fourth surface of the semiconductor substrate and comprising the first insulating element;
        a sixth insulating layer formed over the fourth surface of the second semiconductor substrate with an intervention of the fifth insulating layer therebetween and comprising the second insulating element; and
        a front electrode formed over a side of the third surface of the second semiconductor substrate and coupled to the first penetration electrode of the first semiconductor chip, wherein the front electrode is spaced apart from the fourth insulating layer.

9. The device as claimed in claim 8, wherein a difference in thermal coefficient between the first and third insulating layers of the first semiconductor chip is smaller than a difference in thermal coefficient between the first and second insulating layers of the first semiconductor chip, and a difference in thermal coefficient between the fourth and sixth insulating layers of the second semiconductor chip is smaller than a difference in thermal coefficient between the fourth and fifth insulating layers of the second semiconductor chip.

10. The device as claimed in claim 8, wherein the second insulating element includes thermosetting resin.

11. The device as claimed in claim 8, wherein the first penetration electrode includes a first end portion protruding from the third insulating layer, and a part of the second insulating layer and a part of the third insulating layer are sandwiched between the second surface of the first semiconductor substrate and the first end portion of the first penetration electrode.

12. The device as claimed in claim 11, wherein the front electrode of the second semiconductor chip is coupled to the first end portion of the first penetration electrode of the first semiconductor chip.

13. The device as claimed in claim 8, wherein the second semiconductor chip is stacked with the first semiconductor chip so that a side of the third surface of the second semiconductor substrate faces to a side of the second surface of the first semiconductor substrate.

14. The device as claimed in claim 13, further comprising a sealing resin sandwiched between the third insulating layer of the first semiconductor chip and the fourth insulating layer of the second semiconductor chip.

15. The device as claimed in claim 8, wherein the second semiconductor chip further includes a second penetration electrode penetrating through the second semiconductor substrate, the second circuitry layer, the fifth insulating layer and the sixth insulating layer and coupled to the front electrode.

16. The device as claimed in claim 15, wherein the second penetration electrode includes a second end portion protruding from the sixth insulating layer, and a part of the fifth insulating layer and a part of the sixth insulating layer are sandwiched between the fourth surface of the second semiconductor substrate and the second end portion of the second penetration electrode.

17. The device as claimed in claim 8, wherein each of the first insulating layer of the first semiconductor chip and the fourth insulating layer of the second semiconductor chip include a polyimide resin.

18. The device as claimed in claim 12, wherein the second insulating element includes thermosetting resin.

19. The device as claimed in claim 13, wherein the first insulating element includes a silicon nitride.

* * * * *